(12) United States Patent
Specks et al.

(10) Patent No.: US 6,353,296 B1
(45) Date of Patent: Mar. 5, 2002

(54) ELECTRONIC DRIVER CIRCUIT WITH MULTIPLEXER FOR ALTERNATIVELY DRIVING A LOAD OR A BUS LINE, AND METHOD

(75) Inventors: Will Specks; Markus Strecker, both of München; Ricardo Erckert, Bad Aibling, all of (DE); Francoise Vareilhias, Toulouse (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/418,750

(22) Filed: Oct. 15, 1999

(51) Int. Cl.⁷ ................................................ H02P 1/54
(52) U.S. Cl. ..................... 318/34; 318/49; 327/409; 307/15; 307/29
(58) Field of Search ................... 318/560, 567, 318/568, 569, 34, 35, 49, 113; 327/407–410, 412; 307/1, 4, 11, 12, 15, 29

(56) References Cited

U.S. PATENT DOCUMENTS

| | | | |
|---|---|---|---|
| 4,623,799 A | * 11/1986 | Nyman | 307/260 |
| 5,175,871 A | * 12/1992 | Kunkel | 455/69 |
| 5,182,745 A | * 1/1993 | Heichler | 370/85.1 |
| 5,493,714 A | * 2/1996 | Cahill | 455/259 |
| 5,497,322 A | * 3/1996 | Kolomyski et al. | 364/424.03 |
| 5,914,898 A | * 6/1999 | Sher et al. | 365/189.05 |
| 5,978,546 A | * 11/1999 | Abe et al. | 386/124 |
| 6,055,191 A | * 4/2000 | Sher et al. | 365/189.05 |
| 6,188,877 B1 | * 2/2001 | Boesch et al. | 455/74 |

FOREIGN PATENT DOCUMENTS

| | | | |
|---|---|---|---|
| JP | 01058118 | 3/1989 | .......... H03K/17/00 |
| JP | 09008626 | 1/1997 | .......... H03K/17/693 |
| JP | 09046203 | 2/1997 | .......... H03K/17/687 |
| JP | 10079659 | 3/1998 | ....... H03K/19/0175 |

OTHER PUBLICATIONS

Product Information for "1–A Hex–Half–Bridge / Double Six–Driver, TLE5208–6 G"; Siemens Semiconductor Group, Feb. 1, 1998, pp 1–22.
Product Information for "TPIC0108B PWM Control Intelligent H–Bridge"; Texas Instruments, Dallas, Texas, 1998, pp 1–13.
Product Information for "Motor Bridge for Headlight Adjustment L9907N"; SGS–Thomson, Dec. 1996, pp 1–8.
Product Information for "Quad Half–Bridge and Single High–Side Driver L9947"; STMictroelectronics, Apr. 1999, pp 1–13.

* cited by examiner

Primary Examiner—David S. Martin

(57) ABSTRACT

An electronic system (101/102) for use in a car has an electronic control unit (10) and, in the alternative, either a passive load (11) or an active logic (12) attached thereto. The control unit (10) comprises a push-pull arrangement (20) which can provide drive signals for the load (11) as well as for the logic (12), a multiplexer (45) to alternatively forward a load drive signal of a bus signal to the arrangement (20), and a register (90) to store a mode signal. Further, the control unit (10) automatically determines whether either the load (11) or the logic (12) is attached by analyzing electrical parameters.

13 Claims, 2 Drawing Sheets

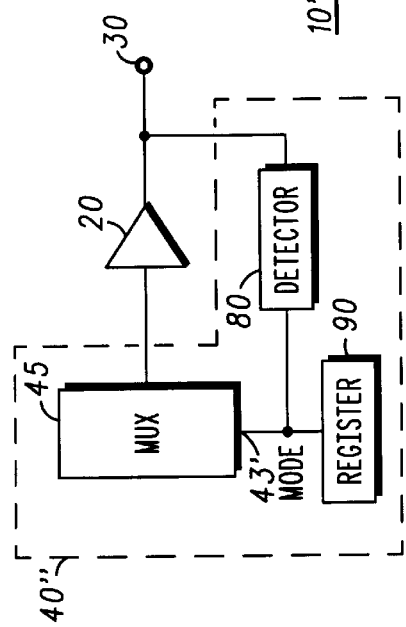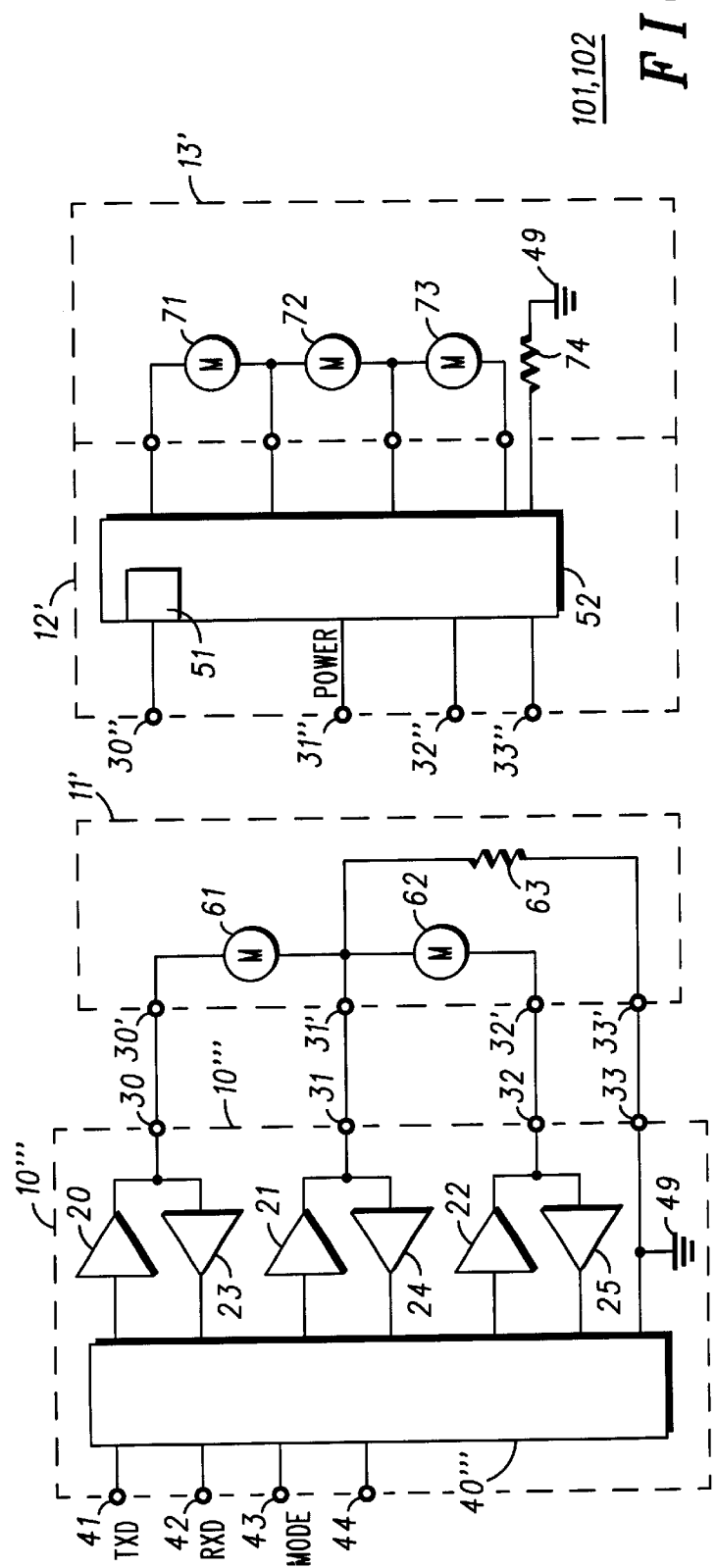

ELECTRONIC DRIVER CIRCUIT WITH MULTIPLEXER FOR ALTERNATIVELY DRIVING A LOAD OR A BUS LINE, AND METHOD

FIELD OF THE INVENTION

The present invention generally relates to electronic circuits, and, more particularly, relates to a driver circuit, and to a method therefore.

BACKGROUND OF THE INVENTION

Electronic circuits are essential in modern cars. Automotive electronics can be found, for example, in motor management systems, ignition and/or injection systems, antilock braking systems, gear shifting, and elsewhere. The combination of mechanical and electronic components, recently known under the term "mechatronics", plays an ever increasing role.

To give an example, for purposes of explanation only, and not intended to be limiting, the rear view mirror can adjusted by pushing keys located inside the car. The mirror has electrical actuators to change its position (e.g. in X-direction and in Y-direction). Usually, control commands are communicated to the mirror actuators by an electronic control unit (ECU). Further, the mirror can comprise a heater to prevent freezing of the mirror glass in winter. Optionally, user specific mirror positions can be stored by the ECU. In some cases, the mirror can have further functions. For example, the actual mirror position can be measured and communicated back to the ECU.

However, further functions require, for example, to have more connection terminals between the mirror and the rest of the car. At the car assembly line, the way how to electrically connect the mirror to the car can be different for each mirror type. The ability to just plug any mirror to a connector common for all types and to immediately start to operate the mirror would be highly desired.

The present invention seeks to provide an electronic control circuit and an operation method which mitigate or avoid these and other disadvantages and limitations of the prior art.

BRIEF DESCRIPTION OF THE DRAWINGS

FIG. 5 illustrates the electronic circuit further comprising a detector and a register;

FIG. 6 illustrates the system of FIGS. 1–2 with the electronic circuit, the load and the logic in a preferred embodiment of the invention.

DETAILED DESCRIPTION OF A PREFERRED EMBODIMENT

Figure 1:
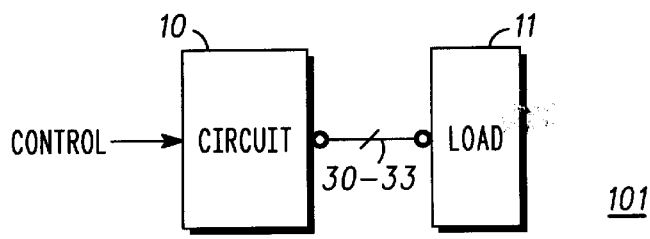
FIG. 1 illustrates an electronic system according to the present invention with an electronic circuit coupled to a load.
Figure 2:
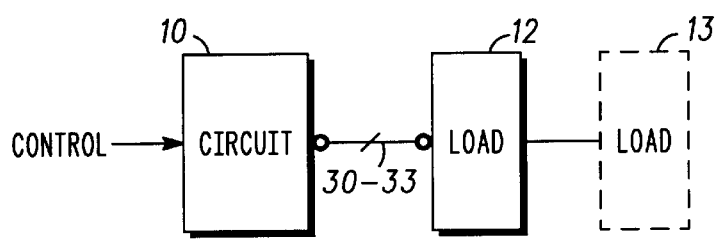
FIG. 2 illustrates an electronic system according to the present invention with the electronic circuit of FIG. 1 coupled to a logic.

FIGS. 1–2 illustrate electronic system 101/102 according to the present invention comprising electronic circuit 10 with the function of the above mentioned electronic control unit (ECU) and, alternatively, load 10 or logic 12 (collectively "attachment 11/12"). Attachment 11/12 has the function of an actuator. Preferably, circuit 10 is coupled to attachment 11/12 during the assembly of system 101/102 by terminal-and-wire arrangement 30–33. Circuit 10 receives a plurality of control signals CONTROL.

FIG. 1 illustrates electronic system 101 according to the present invention with electronic circuit 10 coupled to load 11. Load 11 is passive in the sense not to not forward electrical energy to circuit 10. When load 11 is part of system 101, circuit 10 operates in a first operation mode.

FIG. 2 illustrates electronic system 102 according to the present invention with electronic circuit 10 coupled to logic 12 which is further coupled to alternative load 13. When logic 12 is part of system 102, circuit 10 operates in a second operation mode. Logic 12 is active in the sense not to require electrical energy from circuit 10 (except energy needed to communicate bus signals).

In system 102, arrangement 30–33 comprises at least a single bus line. It is possible that circuit 10 and logic 12 are node elements of a bus network.

In other words, FIGS. 1–2 illustrate that circuit 10 is configurable to operate either as output driver stage for a load (in system 101 of FIG. 1) or as a serial bus interface (in system 102 of FIG. 2). The operation mode of circuit 10 depends on the type of the attachment.

Figure 3:
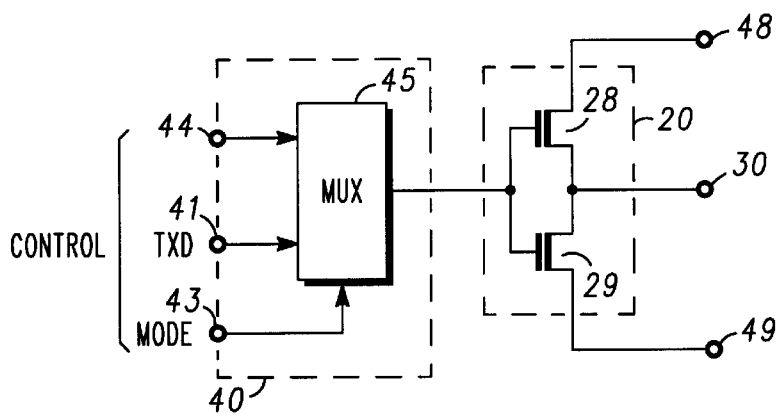
FIG. 3 illustrates the electronic circuit of FIGS. 1–2 with a controller and a push-pull arrangement.

FIG. 3 illustrates electronic circuit 10 with controller 40 and push-pull arrangement 20 (dashed frames). Controller 40 comprises multiplexer 45. Arrangement 20 comprises switches 28 and 29. Multiplexer 45 has load control input 44, bus signal input and mode input 43 (mode control signal MODE). The preferred signal flow is indicated by arrows. The signals at inputs 44, 41 and 43 correspond to signal CONTROL (cf. FIGS. 1–2).

In the first operation mode, arrangement 20 drives load 10 via terminal 30 according to a signal at input 44; and in the second operation mode, arrangement 20 sends a bus signal to logic 12 according to bus signal TXD at input 41.

Switches 28 and 29 are illustrated by transistors having first main electrodes at lines 48 and 49, respectively, second main electrodes coupled together to terminal 30, and control electrodes receiving a signal from multiplexer 45. The coupling of switches 28 and 29 as illustrated in FIG. 3 is simplified. Persons of skill in the art can provide further elements. The transistors can be, for example, field effect transistors (FETs) with drains and sources as main electrodes and gates as control electrodes; bipolar transistors (emitters, collectors, bases); or can be other semiconductor elements. The transistors have to accommodate the maximum voltages and currents which occur in both operation modes.

When (first mode) load 11 is coupled between terminal 30 and a further reference (e.g., ground) at a potential between that of lines 48 and 49, then arrangement 20 can provide drive signals in alternative current directions. This is convenient, for example, to move a motor back and forth, but not essential for the present invention.

When circuit 10 is coupled to logic 12 (second mode), then arrangement 20 conveniently provides binary logic signals with a first logical value at the potential of line 48 (e.g., 5 volts) and a second logical value at the potential of line 49 (e.g., ground at zero).

Switches 28 and 29 can each be replaced by a variable resistance. Or, in other words, the transistors which implement switches 28 and 29 can be controlled by continuous signals. Optionally, switches 28 and 29 accommodate different switching times for both modes (e.g., slowly switching as power driver vs. fast switching as bus interface).

Figure 4:
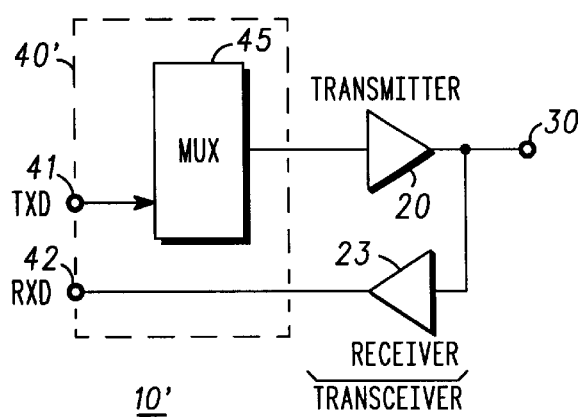
FIG. 4 illustrates the electronic circuit further comprising a receiver and a bus signal output.

Further, optional modifications of circuit 10 are illustrated in the following. FIG. 4 illustrates electronic circuit 10' further comprising receiver 23 and bus signal output 42 (bus signal RXD). Arrangement 20 and multiplexer 45 (part of controller 40) are similar to those of FIG. 3 and therefore shown with less detail. With receiver 23 and arrangement 20 (as transmitter), circuit 10' operates in the second mode as bi-directional bus interface. In other words, the second mode can be classified into a first sub-mode (e.g., transmitting to logic 12) and a second sub-mode (e.g., receiving from logic 12). In the second mode, arrangement 20 (transmitter) and receiver 23 form a bus transceiver. It is well known in the art to coordinate the alternate operation of transmitter 20 and receiver 23.

FIG. 5 illustrates electronic circuit 10" further comprising detector 80 and register 90 (part of controller 40") provided optionally. Detector 80 has an input at terminal 30 and an output going to mode control input 43 of multiplexer 45. Detector 80 analyzes the electrical parameters of attachment 11/12 and thereby determines what type of arrangement 11/12 is coupled to circuit 10 (e.g., by analyzing an impulse response of attachment 11/12). Accordingly, detector 80 sets the operation mode of circuit 10 (MODE). Optionally, register 90 (coupled to multiplexer 45) can be provided to store mode control signal MODE. Register 90 can obtain MODE, for example, from detector 80 or can be programmed during manufacturing system 101/102. Preferably, register 90 is implemented by a non-volatile memory (e.g., EEPROM).

It is an advantage of this implementation that circuit 10" automatically determines whether load 11 or logic 12 is attached.

Detector 80 can be implemented by a comparator (not illustrated) which compares voltage and/or current levels typically occurring at load 11 or logic 12 to predetermined reference levels. For example, when load 10 comprises a motor, than detector 80 can detect the difference in the rise and/or fall pattern of voltage and current caused by the motor coil inductance. Or, detector 80 can detect a predetermined sequence of binary signals issued by logic 12. Preferably, detector 80 operates when arrangement 20 is temporarily disabled, that means when switch 28 alone, switch 29 alone or both switches 28 and 29 together are non-conductive (open load condition). Persons of skill in the art can provide detector 80 and register 90 without the need of further explanation herein similarly or by other means. Although illustrated as separate functional groups, detector 80 and register 90 can be implemented together with other elements of circuit 10 (or circuit 10). For example, detector 80 can use some components of receiver 23 (cf. FIG. 4).

FIG. 6 illustrates system 101/102 with electronic circuit 10''', load 11' and logic 12' (dashed frames) in a preferred embodiment of the present invention. By way of example, load 11 is illustrated as a "simple mirror" with motors 61 and 62 and heater 63; and logic 12 is illustrated in combination with load 13 as a "sophisticated mirror" with motors 71–73 and heater 74. Since both mirror types fit the ECU (circuit 10'''), the manufacturing logistics are simplified and the probability of malfunction due to false programming of the ECU is reduced.

The preferred embodiment of FIG. 6 is now explained with more detail. Circuit 10''' comprises controller 40''', arrangement 20, receiver 23, terminals 30 and inputs 41, 42, 43, 44 (cf. FIG. 3–4) and—additionally—arrangements 21 and 22 (similar to arrangement 20) and receivers 24 and 25 (similar to receiver 23) coupled to further terminals 31, 32 and ground terminal 33 (e.g., at line 49).

For convenience, corresponding terminals in load 11' and logic 12' are indicated by prime markers or double prime markers.

For example, in load 10', motor 61 is coupled between terminals 30' and 31', motor 62 is coupled between terminals 31' and 32'; and heater 63 is coupled between terminals 31' and 33' (ground).

For example, in logic 12', terminal 30" is the bus line terminal going to bus transceiver 51 which is part of controller 52. Terminals 31" and 33" (ground) provide power to controller 52 (e.g., switch 28 conductive, switch 29 non-conductive, cf. FIG. 3). Terminal 32" is, preferably, not used. Logic 12" comprises power switches (not illustrated) to drive the components of load 13" (motor 71, 72, 73, heater 74).

Illustrating the present invention by separate functional blocks is convenient for explanation, but not necessary for the present invention. Preferably, circuit 10 is monolithically integrated into a single chip. It is also possible to implement circuit 10 by a microprocessor and by signal converters (e.g., analog-to-digital converter for receiver 23).

Having explained the present invention in detail above, the invention is now summarized as a system (101/102) with an electronic control unit (e.g., circuit 10) and an actuator (e.g., attachment 11/12), wherein the actuator is alternatively of a first type ("load 11 type") or of a second type ("logic 12 type"), the system is characterized in that the control unit comprises: a push-pull arrangement (cf. arrangement 20) being able to provide drive signals for the actuator independent whether the actuator is of the first type or of the second type (i.e., power or logic signals); a multiplexer (45) alternatively in a first mode forwarding a drive signal (e.g., from input 44) to the push-pull arrangement which powers the actuator of the first type, or, in a second mode forwarding a logic signal (e.g., TXD, from input 41) to the arrangement which forwards the logic signal to the actuator of the second type (12); and a register to store a mode signal for the multiplexer.

Figure 7:
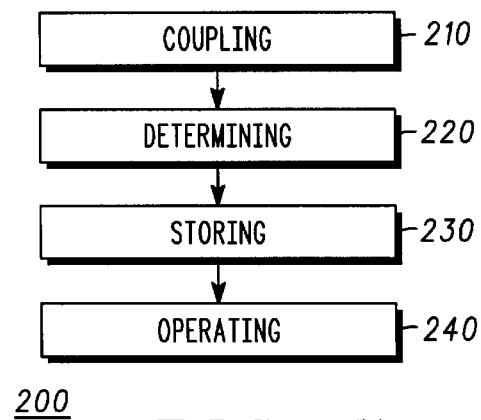
FIG. 7 illustrates a simplified method flow chart diagram of a method to operate the circuit.

FIG. 7 illustrates a simplified method flow chart diagram of method 200 to operate driver circuit 10. Method 200 comprises the steps coupling 210, determining 220, storing 230, and operating 240, preferably, in consecutive order. In coupling step 210, driver circuit 10 is coupled to attachment 11/12 which is either of a load type 11 or of a logic type 12 (still unknown). In determining step 220, detector 80 determines the type of attachment 11/12, preferably, by analyzing the electrical properties of attachment 11/12. In storing step 230, the operation mode corresponding to the type determined in step 220 is stored, for example, in register 90. Finally, in operating step 240, driver circuit 10 either, in a first operation mode provides power signals to load 11, or in a second operation mode provides logic signals to logic 12.

While the invention has been described in terms of particular structures, devices and methods, those of skill in the art will understand based on the description herein that it is not limited merely to such examples and that the full scope of the invention is properly determined by the claims that follow.

What is claimed is:

1. An electronic circuit for use in an electronic system having alternatively an electric load or a logic, said circuit comprising:

a push-pull arrangement for alternatively driving a terminal to a first reference line or to a second reference line;

a multiplexer for receiving a drive signal or a first bus signal, said multiplexer being controlled by a mode select signal, said circuit in a first operation mode driving said electric load coupled to said terminal or in a second operation mode communicating said first bus signal to said logic coupled to said terminal.

2. The circuit of claim 1 which drives a motor load.

3. The circuit of claim 1 further comprising a receiver having an input coupled to said terminal to temporarily receive in said second operation mode a second bus signal.

4. The circuit of claim 1 further comprising a detector which determines whether said load or said logic is coupled to said terminal which sets said mode select signal accordingly.

5. The circuit of claim 4 wherein said detector analyzes an impulse response of a device attached to determines whether said device is said load or said logic.

6. The circuit of claim 4 wherein said detector operates when said push-pull arrangement is temporarily disabled.

7. The circuit of claim 1 wherein said push-pull arrangement drives said terminal in said first and second operation modes with different speeds.

8. The circuit of claim 1 further comprising a register for storing said mode select signal.

9. The circuit of claim 8 wherein said register is a non-volatile memory.

10. A system with an electronic control unit and an actuator, wherein said actuator is alternatively of a first type or of a second type, said system characterized in that said control unit comprises:

a push-pull arrangement being able to provide signals for said actuator independent whether said actuator is of said first type or of said second type; and a multiplexer alternatively in a first mode forwarding a drive signal to said push-pull arrangement which powers said actuator of said first type, or, in a second mode forwarding a logic signal to said push-pull arrangement which further forwards said logic signal to said actuator of said second type; and a register to store a mode signal for said multiplexer.

11. The system of claim 10 wherein said actuator is a passive electrical component when said multiplexer operates in said first mode.

12. The system of claim 11 wherein said actuator is a motor arrangement.

13. The system of claim 12 wherein said motor arrangement drives a rear view mirror for a car.

* * * * *